(12) United States Patent
Suzuki et al.

(10) Patent No.: US 8,734,901 B2
(45) Date of Patent: May 27, 2014

(54) FILM DEPOSITION METHOD AND APPARATUS

(75) Inventors: Keisuke Suzuki, Yamanashi (JP); Pao-Hwa Chou, Tokyo (JP); Te ching Chang, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 113 days.

(21) Appl. No.: 13/401,919

(22) Filed: Feb. 22, 2012

(65) Prior Publication Data

US 2012/0269969 A1 Oct. 25, 2012

(30) Foreign Application Priority Data

Feb. 24, 2011 (JP) .................................. 2011-038509

(51) Int. Cl.
*C23C 16/00* (2006.01)
(52) U.S. Cl.
USPC ...................................................... 427/248.1
(58) Field of Classification Search
USPC ...................................................... 427/248.1
See application file for complete search history.

(56) References Cited

U.S. PATENT DOCUMENTS

| 7,625,609 B2 * | 12/2009 | Matsuura ....................... 427/579 |
| 8,176,871 B2 * | 5/2012 | Okuda et al. ................ 118/723 E |
| 2009/0203227 A1 * | 8/2009 | Hasebe et al. ................. 438/787 |

FOREIGN PATENT DOCUMENTS

| JP | 2004-006801 | 1/2004 |
| JP | 2004-228602 | 8/2004 |
| JP | 2009-004608 | 1/2009 |
| JP | 2009-132961 | 6/2009 |

* cited by examiner

*Primary Examiner* — Kelly M Gambetta
(74) *Attorney, Agent, or Firm* — IPUSA, PLLC (57) ABSTRACT

A film deposition method of depositing a thin film by alternately supplying at least a first source gas and a second source gas to a substrate is disclosed. The film deposition method includes steps of evacuating a process chamber where the substrate is accommodated, without supplying any gas to the process chamber; supplying an inert gas to the process chamber until a pressure within the process chamber becomes a predetermined pressure; supplying the first source gas to the process chamber filled with the inert gas at the predetermined pressure without evacuating the process chamber; stopping supplying the first source gas to the process chamber and evacuating the process chamber; supplying the second source gas to the process chamber; and stopping supplying the second source gas to the process chamber and evacuating the process chamber.

4 Claims, 7 Drawing Sheets

FILM DEPOSITION METHOD AND APPARATUS

CROSS-REFERENCE TO RELATED APPLICATION

The present application is based on Japanese Patent Application No. 2011-038509 filed with the Japanese Patent Office on Feb. 24, 2011, the entire contents of which are hereby incorporated herein by reference.

BACKGROUND OF THE INVENTION

1. Field of the Invention

The present invention relates to a film deposition method and apparatus where at least a first source gas and a second source gas are alternately supplied to a substrate, thereby depositing a film formed through chemical reaction between the first and the second source gases on the substrate.

2. Description of the Related Art

In a fabrication process of semiconductor integrated circuits (ICs), in order to deposit, for example, an insulating film, an atomic layer deposition (ALD) method may be used where a first source gas and a second source gas for forming the insulating film are alternately supplied to a substrate, thereby depositing the insulating film on the substrate. Because the ALD method can utilize self-limiting adsorption of the source gases on the substrate, film thickness uniformity of the deposited film is expected to be excellent. In addition, because a film thickness can be determined by the number of cycles of alternately supplying the first and the second source gases, thickness controllability is expected to be excellent (see Patent Document 1, for example).

Patent Document 1: Japanese Patent Application Laid-Open Publication No. 2004-6801.

SUMMARY OF THE INVENTION

When a thin film is deposited on a substrate, it is not always preferable that the deposited film has excellent film thickness uniformity. For example, in the case of a silicon nitride film deposited by a conventional low pressure chemical vapor deposition method, it may be preferable that the deposited film has a thickness profile where a film is thick in the center area and becomes thinner toward the circumferential area on the substrate. This is because the film having such a thickness distribution is deposited and then an etching profile in a subsequent etching process is determined taking into consideration such a thickness distribution. This can be useful for suppressing a micro loading effect, which is caused from pattern miniaturization.

Therefore, when the film is deposited on the substrate by the ALD method, even if the ALD method can achieve excellent thickness uniformity, it is desired that the film deposited by the ALD method have such a film thickness distribution.

The present invention has been made in view of the above, and is directed toward providing a film deposition method and apparatus that are capable of depositing a thin film having a desired film thickness distribution.

According to an aspect of the present invention, there is provided a film deposition method of depositing a thin film by alternately supplying at least a first source gas and a second source gas to a substrate thereby allowing the first and the second source gases to react with each other on the substrate. The film deposition method includes steps of: evacuating a process chamber where the substrate is accommodated, without supplying any gas to the process chamber; supplying an inert gas to the process chamber until a pressure within the process chamber becomes a predetermined pressure; supplying the first source gas to the process chamber filled with the inert gas at the predetermined pressure without evacuating the process chamber; stopping supplying the first source gas to the process chamber and evacuating the process chamber; supplying the second source gas to the process chamber; and stopping supplying the second source gas to the process chamber and evacuating the process chamber.

DETAILED DESCRIPTION OF THE PREFERRED EMBODIMENT

Non-limiting, exemplary embodiments of the present invention will now be described with reference to the accompanying drawings. In the drawings, the same or corresponding reference symbols are given to the same or corresponding members or components. It is to be noted that the drawings are illustrative of the invention, and there is no intention to indicate scale or relative proportions among the members or components, or between thicknesses of various layers. Therefore, the specific thickness or size should be determined by a person having ordinary skill in the art in view of the following non-limiting embodiments.

Figure 1:
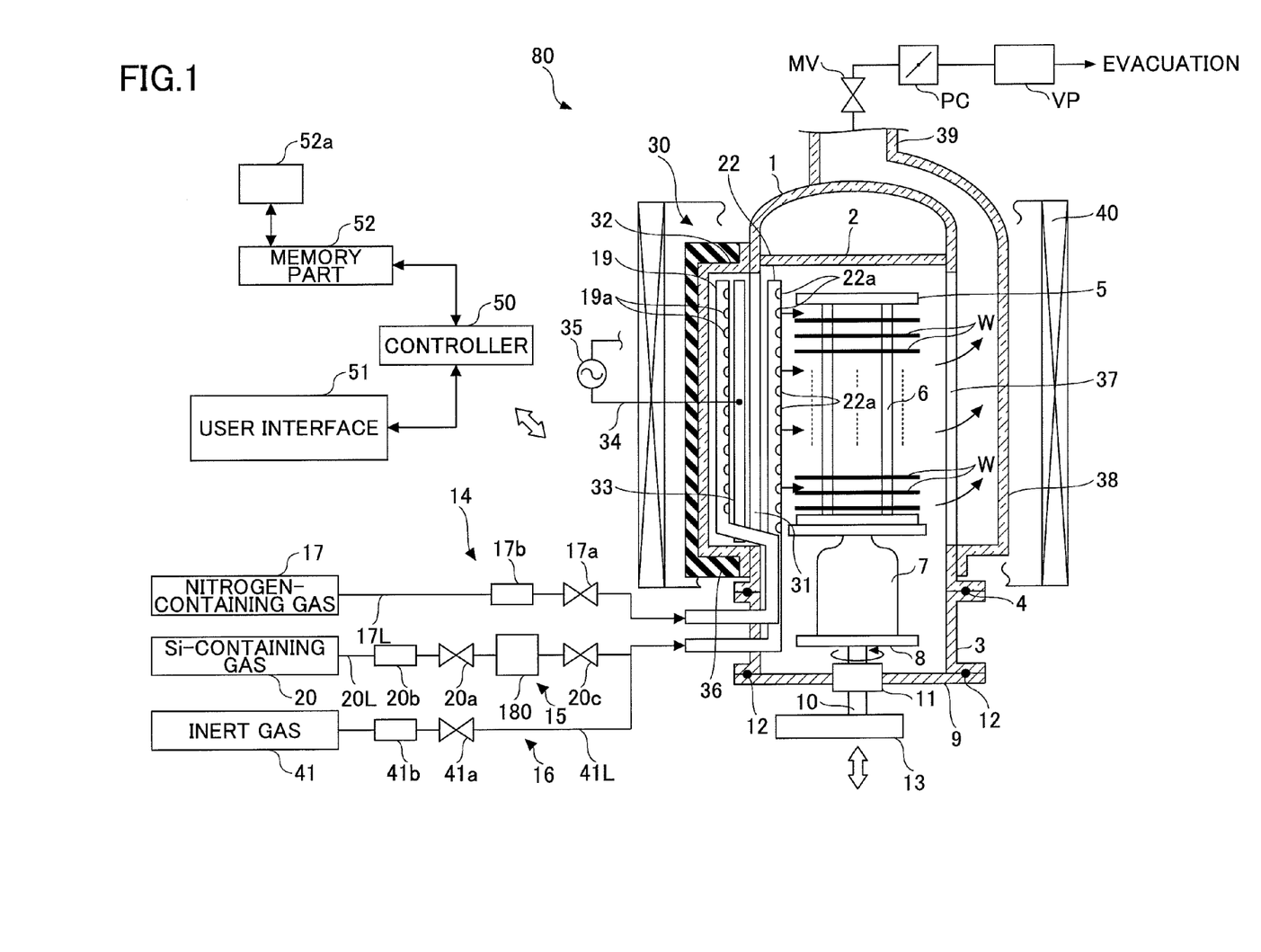
FIG. 1 is a schematic view illustrating a film deposition apparatus according to an embodiment of the present invention.
Figure 2:
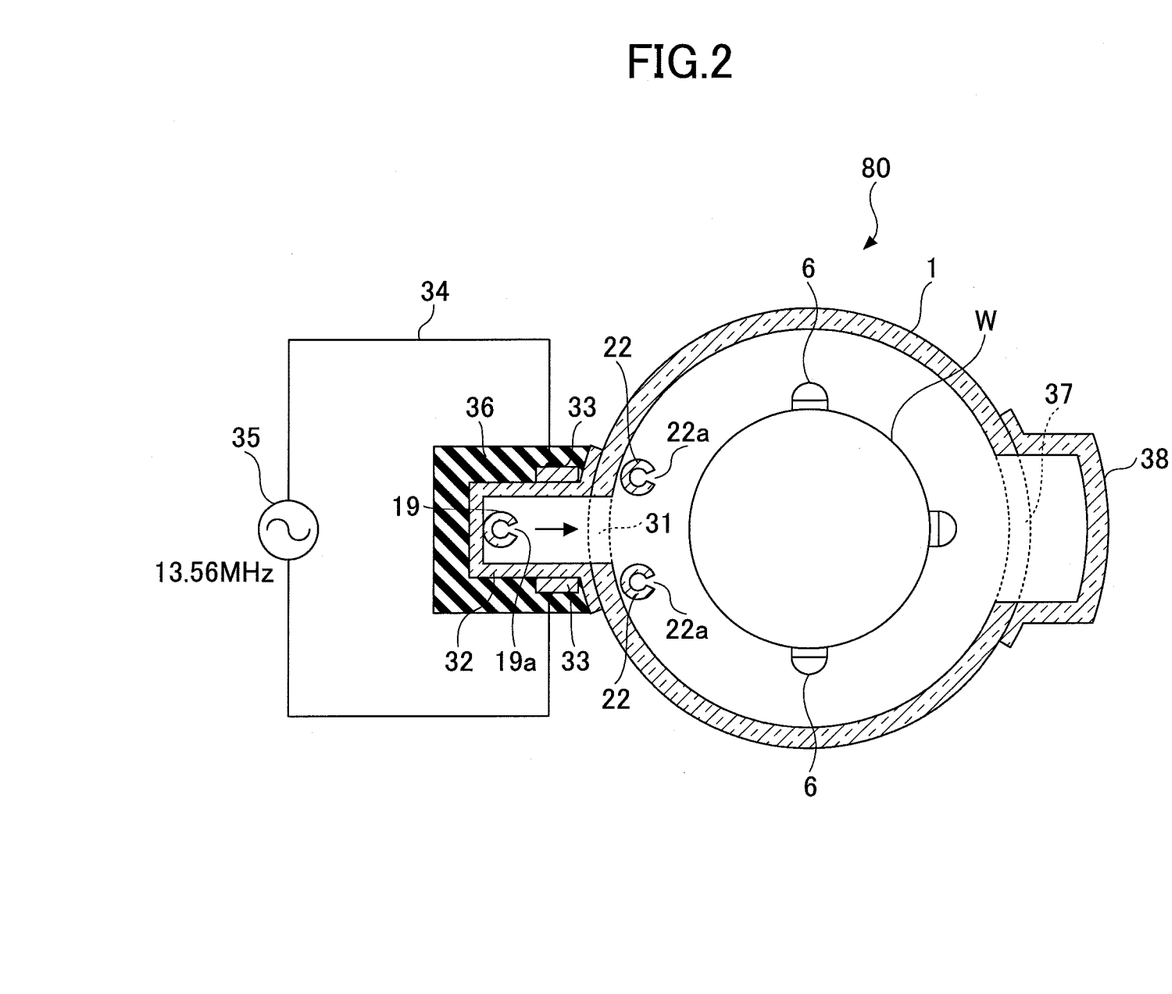
FIG. 2 is a cross-sectional view of the film deposition apparatus according to the embodiment of the present invention.

FIG. 1 is a cross-sectional elevation view of schematically illustrating an atomic layer deposition (ALD) apparatus according to an embodiment of the present invention, and FIG. 2 is a cross-sectional plan view of schematically illustrating the ALD apparatus.

Referring to FIG. 1, an ALD apparatus 80 includes a process tube 1 that has a shape of a cylinder with a closed top and a bottom opening and is made of, for example, quartz glass. The process tube 1 is provided in its upper inside part with a top plate 2 made of, for example, quartz glass. In addition, a manifold 3 that has a cylindrical shape and is made of, for example, stainless steel is connected to the bottom opening of the process tube 1 via a sealing member 4 such as an O-ring.

The manifold 3 allows predetermined gases to be introduced into the process tube 1, while serving as a supporting member that supports a bottom end of the process tube 1. Namely, plural through holes (not shown) are formed on a side wall of the manifold 3 and plural gas pipes (described later) are connected to the corresponding through holes.

The manifold 3 has a bottom opening, and a lid member 9 is coupled to the bottom end of the manifold 3 via a sealing member 12 such as an O-ring, in order to open or close the bottom opening of the manifold 3. The lid member 9 has a center opening through which a rotational shaft passes in an airtight manner. A table 8 is placed on an upper end of a rotational shaft 10; a heat retention cylinder 7, which is made of, for example, quartz glass is placed on the table 8; and a wafer boat 5 is placed on the heat retention cylinder 7. As shown in FIG. 2, the wafer boat 5 has three pillars 6. The three pillars 6 have plural grooves, so that plural wafers W are supported by the grooves. The rotational shaft 10 may be rotated by a rotation mechanism (not shown), so that the rotational shaft 10 and thus the wafer boat 5 are rotated around a vertical axis.

A bottom end of the rotational shaft 10 is attached to an arm 13 that is elevatably supported by an elevation mechanism (not shown). By moving the arm 13 upward and downward, the wafer boat 5 is transferred into and out from the process tube 1 by the arm 13. Incidentally, a magnetic fluid seal 11 is provided between the rotational shaft 10 and the lid member 9, so that the process tube 1 can be sealed in an airtight manner.

In addition, the ALD apparatus 80 is provided with a nitrogen-containing gas supplying mechanism 14 that supplies a nitrogen-containing gas to the process tube 1, a silicon-containing gas supplying mechanism 15 that supplies a silicon-containing gas to the process tube 1, and an inert gas supplying mechanism 16 that supplies an inert gas to the process tube 1.

The nitrogen-containing gas supplying mechanism 14 includes a nitrogen-containing gas supplying source 17, a nitrogen-containing gas supplying pipe 17L that guides the nitrogen-containing gas from the nitrogen-containing gas supplying source 17, and a nitrogen-containing gas distribution nozzle 19. The nitrogen-containing gas distribution nozzle 19 is connected to the nitrogen-containing gas supplying pipe 17L, passes through the manifold 3, and is bent upward within the process tube 1. The nitrogen-containing gas distribution nozzle 19 is made of, for example, quartz glass. Plural gas ejection holes 19a are formed at predetermined intervals in a vertically extending part of the nitrogen-containing gas distribution nozzle 19, so that the nitrogen-containing gas is uniformly ejected in a horizontal direction from each of the plural gas ejection holes 19a.

In addition, the nitrogen-containing gas supplying pipe 17L is provided with an open/close valve 17a and a flow rate controller 17b that controls a flow rate of the nitrogen-containing gas. With these, the start/stop of supplying the nitrogen-containing gas and the flow rate of the nitrogen-containing gas are controlled.

The silicon-containing gas supplying mechanism 15 includes a silicon-containing gas source 20, a silicon-containing gas supplying pipe 20L that guides the silicon-containing gas from the silicon-containing gas supplying source 20, and a silicon-containing gas distribution nozzle 22. The silicon-containing gas distribution nozzle 22 is connected to the silicon-containing gas supplying pipe 20L, passes through the manifold 3, and is bent upward within the process tube 1 to extend in a vertical direction. The silicon-containing gas distribution nozzle 22 is made of, for example, quartz glass. Referring to FIG. 2, two silicon-containing gas distribution nozzles 22 are provided in this embodiment. Plural gas ejection holes 22a are formed at predetermined intervals in a vertically extending part of each of the silicon-containing gas distribution nozzles 22, so that the silicon-containing gas is uniformly ejected in a horizontal direction from each of the plural gas ejection holes 22a. Incidentally, the number of the silicon-containing gas distribution nozzles 22 is not limited to two, but may be only one, or three or more.

In addition, the silicon-containing gas supplying pipe 20L is provided with an open/close valve 20a, a flow rate controller 20b, a buffer tank 180, and an open/close valve 20c. For example, when the open/close valve 20a is opened while the open/close valve 20c is closed and the silicon-containing gas is supplied from the silicon-containing gas supplying source 20, the silicon-containing gas is temporarily retained in the buffer tank 180. Then, when the open/close valve 20a is closed and the open/close valve 20c is opened, a predetermined amount of the silicon-containing gas retained in the buffer tank can be supplied to the process tube 1.

The inert gas supplying mechanism 16 includes an inert gas source 41, an inert gas supplying pipe 41L that guides the inert gas from the inert gas supplying source 41 and is merged into the silicon-containing gas supplying pipe 20L. Because the inert gas supplying pipe 41L is merged into the silicon-containing gas pipe 41L, the inert gas is ejected from the silicon-containing gas distribution nozzle 22 into the process tube 1. In addition, the inert gas supplying pipe 41L is provided with an open/close valve 41a and a flow rate controller 41b that controls a flow rate of the inert gas. With these, the start/stop of supplying the inert gas and the flow rate of the inert gas are controlled.

A plasma generation mechanism 30 is formed in a part of the circumferential wall of the process tube 1. The plasma generation mechanism 30 includes an opening 31 that is made in the circumferential wall of the process tube 1 and has the shape of a vertically oblong rectangle, and a plasma partitioning wall 32 that is welded to cover the opening 31 from the outside. Specifically, the plasma partitioning wall 32 has a box shape that has a vertical length sufficient to cover the opening 31, and is made of, for example, quartz glass. Because of the plasma partitioning wall 32, it appears that a part of the circumferential wall of the process tube 1 is indented outward. An inner space of the plasma partitioning wall 32 communicates with an inner space of the process tube 1. In addition, the opening 31 is long enough in a vertical direction to span from the lowest wafer W to the highest wafer W loaded in the wafer boat 5.

In addition, the plasma generation mechanism 30 includes a pair of plasma electrodes 33, 33 and a high frequency power source 35 that supplies high frequency power to the plasma electrodes 33, 33 via a feed line 34. One of the plasma electrodes 33, 33 extends in a vertical direction near one of outer side surfaces of the plasma partitioning wall 32, and the other one of the plasma electrodes 33, 33 extends in a vertical direction near the other one of the outer side surfaces of the plasma partitioning wall 32, so that the plasma electrodes 33, 33 oppose each other across the plasma portioning wall 32. When electric power at a frequency of 13.56 MHz is applied from the high frequency power source 35 to the plasma electrodes 33, 33, plasma is generated within the plasma partitioning wall 32. Incidentally, the frequency of the electric power is not limited to 13.56 MHz, but may be 400 kHz, for example.

Incidentally, as shown in FIG. 1, the nitrogen-containing gas distribution nozzle 19 is bent in an outward direction and then bent again upward near the inner surface of the plasma partitioning wall 32, thereby to extend upward along the inner surface of the plasma partitioning wall 32. Therefore, the nitrogen-containing gas ejected from the nitrogen-containing gas distribution nozzle 19 flows through the inner space of the plasma partitioning wall 32, and is electromagnetically excited by the electric power supplied to the plasma electrodes 33, 33, thereby generating the plasma. In other words, the nitrogen-containing gas is excited sufficiently to be transformed into plasma and flows toward the center of the process tube 1.

An insulating protection cover 36 is attached on the outer surface of the plasma partitioning wall 32, so that the plasma partitioning wall 32 and the plasma electrodes 33, 33 are covered by the insulating protection cover 36. In addition, a cooling fluid conduit (not shown) is formed inside of the insulating protection cover 36. When cooled nitrogen gas is supplied to the cooling fluid conduit, the plasma electrodes 33, 33 can be cooled.

The two silicon-containing gas distribution nozzles 22 stand one on one side of the opening 31 and the other on the other side of the opening 31 of the process tube 1. The two silicon-containing gas distribution nozzles 22 eject the silicon-containing gas toward a center part of the process tube 1 from the plural ejection holes 22a of the corresponding silicon-containing gas distribution nozzles 22.

Incidentally, as the silicon-containing gas, dichlorosilane (DCS), hexachlorodisilane (HCD), monosilane ($SiH_4$), disilane ($Si_2H_6$), hexamethyldisilazane (HMDS), tetrachlorosilane (TCS), disilylamine (DSA), trisilylamine (TSA), bis(tertiary-butylamino)silane (BTBAS, $SiH_2(NH(C_4H_9))_2$), or the like may be used. In addition, as the nitrogen-containing gas, ammonia ($NH_3$) gas, hydrazine ($N_2H_2$), or the like may be used.

An evacuation opening 37 for evacuating the process tube 1 is provided on the other side of the opening 31 in the process tube 1. The evacuation opening 37 has a vertically oblong rectangular shape in this embodiment, and is formed by removing a part of the circumferential wall of the process tube 1. As shown in FIG. 2, an evacuation opening cover member 38, which has a substantially U-shaped cross-section, is welded onto the outer circumferential surface of the process tube 1 in order to cover the evacuation opening 37. The evacuation opening cover member 38 extends upward along the outer circumferential wall of the process tube 1, and defines a gas outlet port 39 in an upper part of the process tube 1. The gas outlet port 39 is connected to a vacuum pump VP via a main valve MV and a pressure controller PC, so that the process tube 1 is evacuated at a controlled pressure by the vacuum pump VP. The vacuum pump VP may include a mechanical booster pump and a turbo molecular pump.

In addition, a heating unit 40 having a cylindrical shape is provided in order to surround the process tube 1, so that the wafers W in the process tube 1 are heated, as shown in FIG. 1. Incidentally, the heating unit 40 is omitted in FIG. 2.

The ALD apparatus 80 is provided with a controller 50 including a microprocessor (or computer) that controls operations of the ALD apparatus 80. For example, the controller 50 controls on/off operations of the open/close valves 17a, 20a to 20c, and 41a, thereby controlling starting/stopping the gases, and controls the flow rate controllers 17b, 20b, 41b, thereby adjusting flow rates of the gases. In addition, the controller 50 controls the heating unit 40, thereby heating the wafers W at a predetermined temperature. The controller 50 is connected to a user interface 51 composed of a keyboard (not shown) through which an operator can input process parameters or commands and a display (not shown) that may illustrate process situations.

In addition, the controller 50 is connected to a memory part 52 that stores programs or recipes for the controller 50 to cause the ALD apparatus to carry out various treatments with respect to the wafers W. The programs include a film deposition program by which a film deposition method (described later) is carried out by the ALD apparatus 80 under control of the controller 50. In addition, the programs are stored in a computer readable storage medium 52a and downloaded to the memory part 52. The computer readable storage medium 52a may be a hard disk, a semiconductor memory, a compact disk-read only memory (CD-ROM), a digital versatile disk (DVD), a flash memory or the like. In addition, the programs may be downloaded to the memory part 52 from another apparatus through, for example, a dedicated network.

When needed, an arbitrary program is read out from the memory part 52 in response to instructions from the user interface 51, and is executed by the controller 50, so that a corresponding treatment is carried out under control of the controller 50. When the film deposition program is carried out, the controller 50 serves as a controlling unit that controls the components and parts of the ALD apparatus 80, thereby carrying out the film deposition method.

Figure 3:
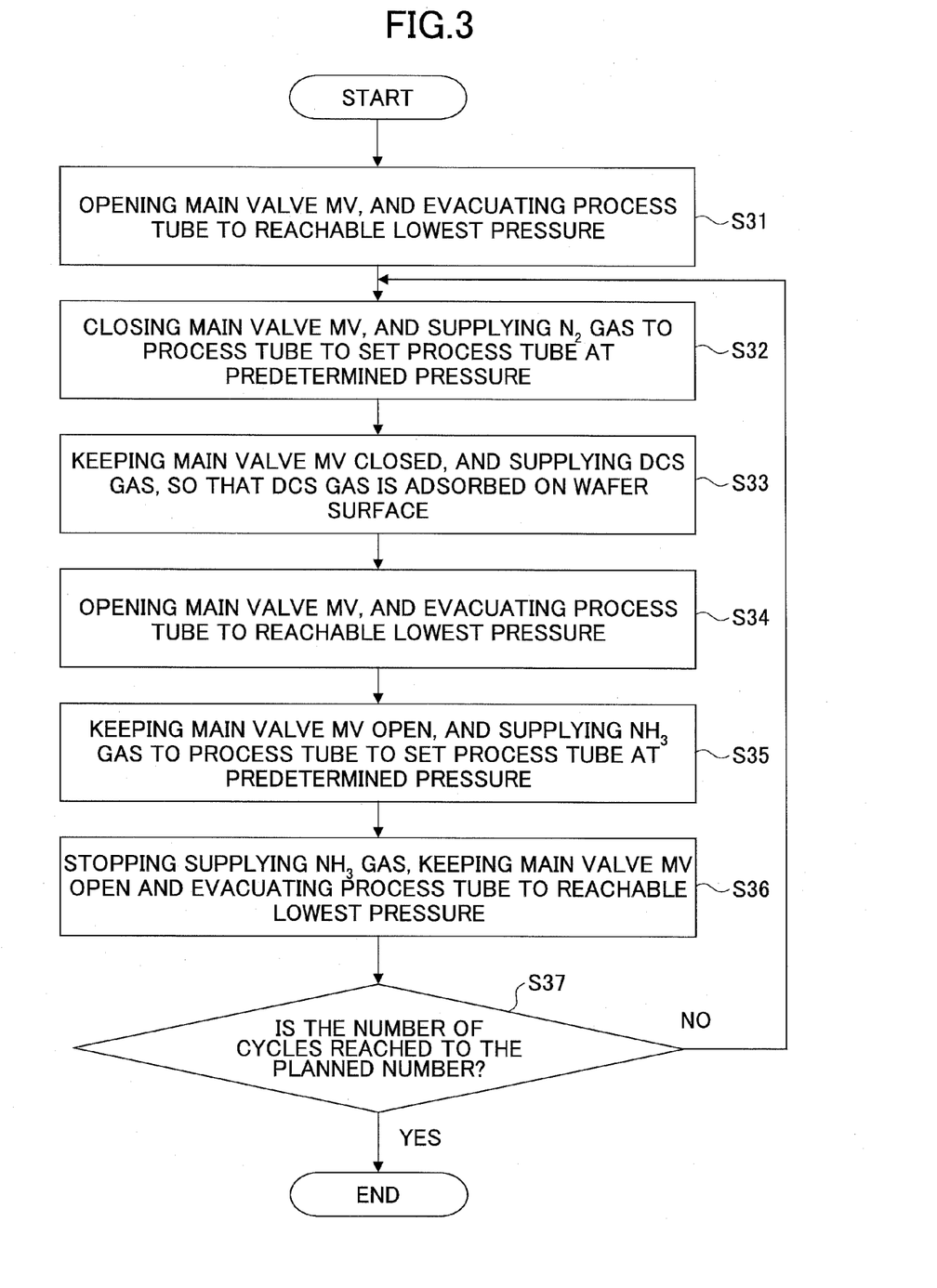
FIG. 3 is a flowchart illustrating a film deposition method according to an embodiment of the present invention.
Figure 4:
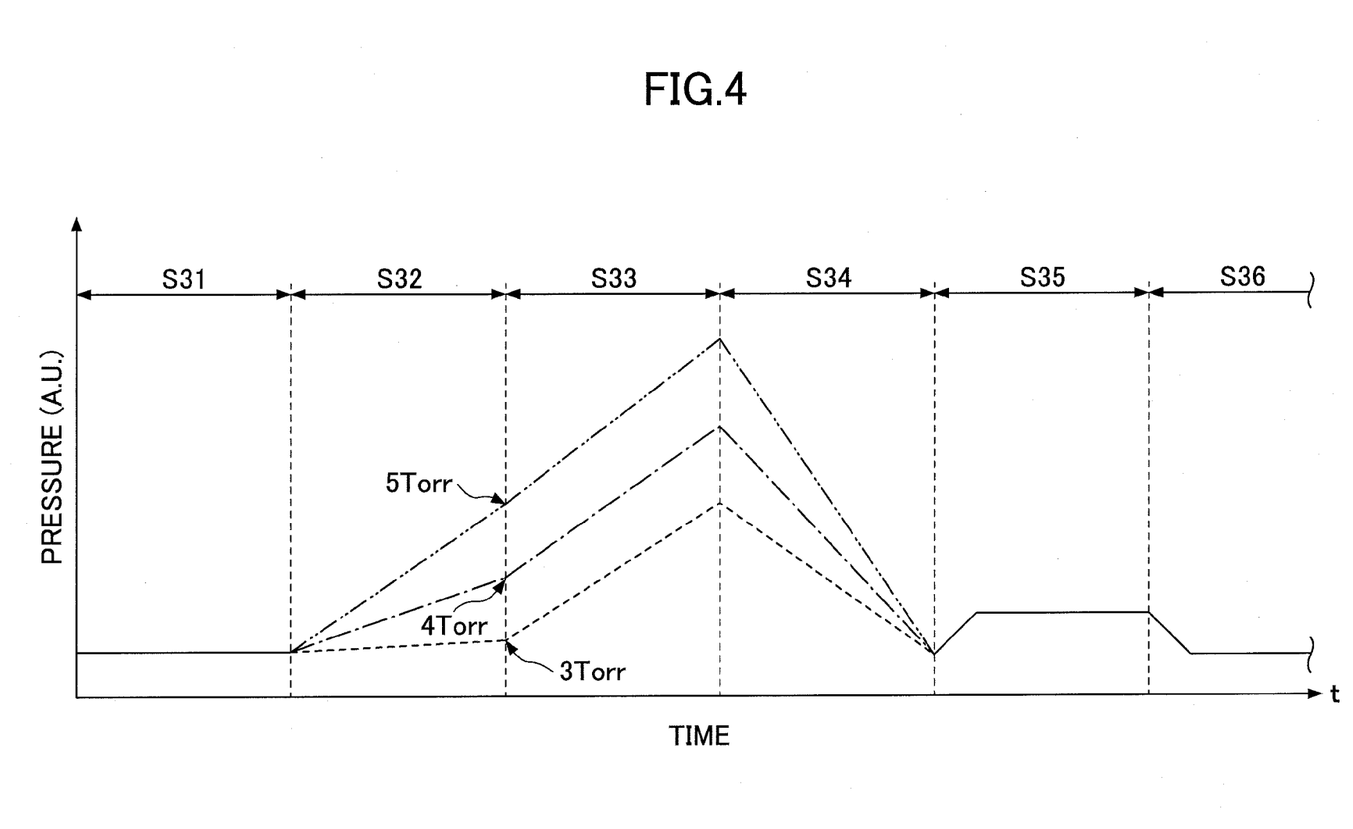
FIG. 4 is a pressure chart illustrating a pressure within a process chamber of the film deposition apparatus according to the embodiment of the present invention.

Next, referring to FIGS. 3 and 4 in addition to FIGS. 1 and 2, a film deposition method according to an embodiment of the present invention is explained, taking an example where the film deposition method is carried out in the ALD apparatus 80. In addition, the $NH_3$ gas is used as the nitrogen-containing gas and the DCS gas is used as the silicon-containing gas.

First, the wafers W are loaded into the wafer boat 5, and the wafer boat 5 is transferred into the process tube 1 by the arm 13. The wafer boat 5 is rotated around a vertical axis. Then, the main valve MV is opened while no gas is supplied to the process tube 1 (or while the open/close valves 17a, 20c, and 41a are closed), and a pressure controlling valve of the pressure controller PC is fully opened, so that the process tube 1 is evacuated to the lowest reachable pressure by the vacuum pump VP (Step S31 of FIG. 3).

After the process tube 1 is evacuated for a predetermined time period, the main valve MV is closed, and a nitrogen gas as the inert gas is supplied with its flow rate controlled by the flow rate controller 41b to the process tube 1 through the inert gas supplying pipe 41L, the silicon-containing gas supplying pipe 20L, and the silicon-containing gas distribution nozzle 22, at Step S32 (FIG. 3). With this, a pressure within the process tube 1 is increased to, for example, 3, 4, or 5 Torr (400, 533, 667 Pa, respectively) depending on a flow rate of the nitrogen gas (or an amount of the nitrogen gas) supplied to the process tube 1, as shown in FIG. 4. The pressure within the process tube 1 may be, for example, 0.05 Torr (6.67 Pa) or more.

When the nitrogen gas is supplied to the process tube 1 with the main valve MV is closed, the open/close valve 20a is opened while the open/close valve 20c is closed in the silicon-containing gas supplying pipe 20L. In addition, the DCS gas is supplied with its flow rate controlled by the flow rate controller 20b from the silicon-containing gas source 20 to the buffer tank 180, and thus the buffer tank 180 is filled with the DCS gas. In this case, an amount of the DCS gas filling the buffer tank 180 (or the number of DCS gas molecules) may be determined so that upper surfaces of the wafers W supported by the wafer boat 5 are covered with the DCS gas molecules, and specifically, may be determined by carrying out a preliminary experiment.

Next, while keeping the main valve MV closed, the open/close valve 41a of the inert gas supplying pipe 41L is closed thereby stopping supplying the $N_2$ gas, and then, the DCS gas filling the buffer tank 180 is supplied to the process tube 1 by opening the open/close valve 20c at Step S33 (FIG. 3). With this, an inner space of the process tube 1 is under environment of a mixed gas of the $N_2$ gas and the DCS gas, and the pressure within the process tube 1 is increased depending on the amount of the DCS gas in the buffer tank 180 (see FIG. 4). The DCS gas is adsorbed on the upper surfaces of the wafers W.

After the DOS gas is supplied to the process tube 1, the open/close valve 20c is closed and the main valve MV is opened, thereby evacuating the process tube 1 to the lowest reachable pressure at Step S34 (FIG. 3). With this, the DCS gas within the process tube 1 is evacuated and the pressure within the process tube 1 is decreased as shown in FIG. 4.

Next, the open/close valve 17a is opened thereby supplying the NH$_3$ gas from the nitrogen-containing gas source 17 to the process tube 1, and the high frequency electric power of 13.56 MHz is supplied from the high frequency power source 35 to the plasma electrodes 33, 33 at Step S35. With this, the pressure within the process tube 1 is maintained at a certain pressure depending on a flow rate of the NH$_3$ gas supplied to the process tube 1, as shown in FIG. 4. In addition, plasma is generated from the NH$_3$ gas between the plasma electrodes 33, 33, and thus the NH$_3$ gas is excited thereby generating an active species such as ions and radicals. The active species flow toward the wafers W supported by the wafer boat 3, and react with the DCS gas adsorbed on the upper surfaces of the wafers W, thereby producing silicon nitride on the upper surfaces of the wafers W.

After a time period that allows the active species originating from the NH$_3$ gas to fully react with the DCS gas has passed, supplying the NH$_3$ gas is terminated, and the main valve MV of the process tube 1 is opened, thereby evacuating the process tube 1 to the lowest reachable pressure at Step S36 (FIG. 3).

Subsequently, the Steps S31 through S36 described above are repeated when the expected number of repetitions is not reached (Step S37: NO). On the other hand, the deposition of the silicon nitride film is terminated when the expected number of repetitions is reached (Step S37: YES). Specifically, after the main valve MV has been opened once thereby evacuating the process tube 1 to the lowest reachable pressure, the main valve MV is closed and the N$_2$ gas is supplied into the process tube 1 until the pressure within the process tube 1 is increased to the atmospheric pressure. Next, the wafer boat 5 is transferred out from the process tube 1 by the arm 13, and the wafers W are taken out from the wafer boat 5 by a loader/unloader (not shown), and thus the film deposition process is completed.

Next, an experiment was carried out to deposit a silicon nitride film on a silicon wafer in accordance with the film deposition method and the results are explained with reference to FIGS. 5 and 6. In this experiment, the silicon nitride films were deposited on the wafers while the pressure within the process tube 1 at Step 32 (FIG. 3) where the N$_2$ gas was supplied to the process tube 1 (or before the DCS gas was supplied to the process tube 1) was set to be 0.08, 2.67, 3.24, and 3.91 Torr (10.7, 356, 432, and 521 Pa, respectively). The thicknesses and thickness distributions of the silicon nitride films across the wafers were measured.

Figure 5:
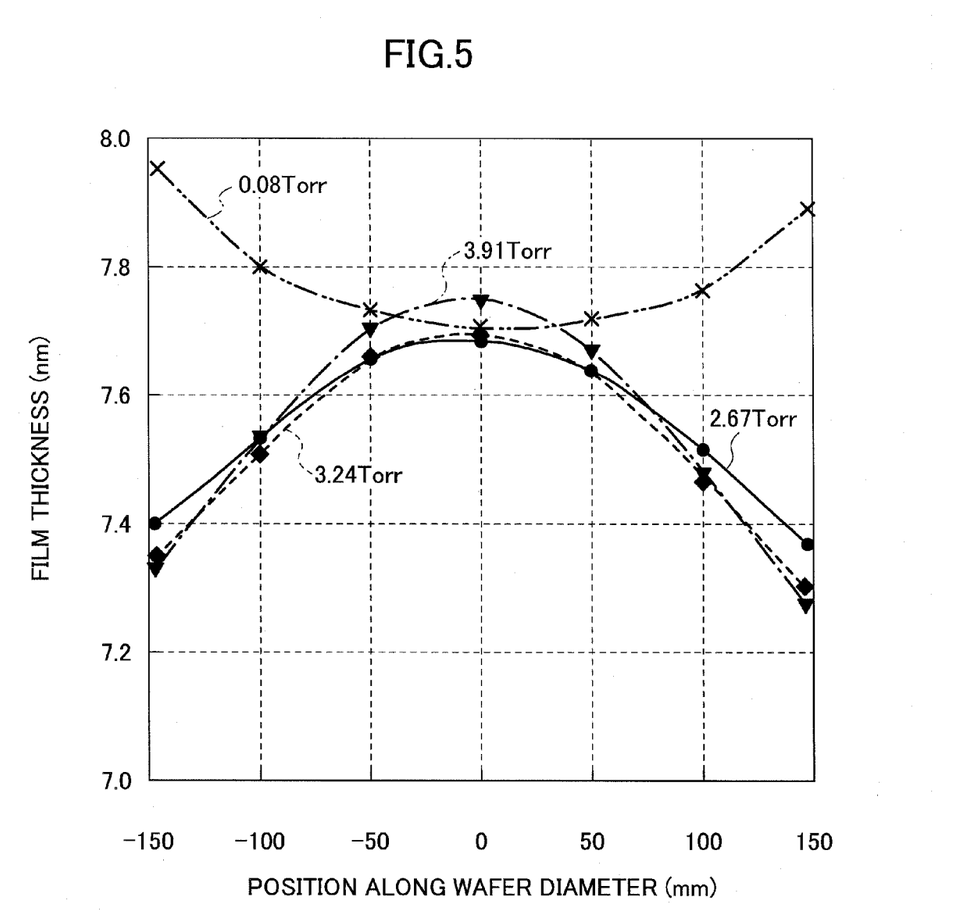
FIG. 5 is a graph that illustrates a film thickness distribution of a silicon nitride film deposited by the film deposition method according to the embodiment of the present invention.

FIG. 5 is a graph illustrating the results of the experiment, where a horizontal axis represents a position along a diameter of the wafer in the units of mm, and a vertical axis represents a film thickness in the units of nm. As shown, when the pressure within the process tube 1 is 0.08 Torr (10.7 Pa) at Step S32, the silicon nitride film has a concave thickness distribution. Namely, the silicon nitride film is thinner in a center part thereof and thicker in a circumferential area. On the other hand, when the pressure within the process tube 1 at Step S32 is 2.67, 3.24, and 3.91 Torr, the silicon nitride film has a convex thickness distribution. Namely, the silicon nitride film is thicker in the center part and thinner in the circumferential area. Namely, when the pressure within the process tube 1 is increased from 0.08 Torr to 2.67 Torr, the film thickness distribution is changed from a concave pattern to a convex pattern. Therefore, it has been confirmed that the film thickness distribution can be controlled by adjusting the pressure within the process tube 1 before supplying the DCS gas into the process tube 1.

Figure 6:
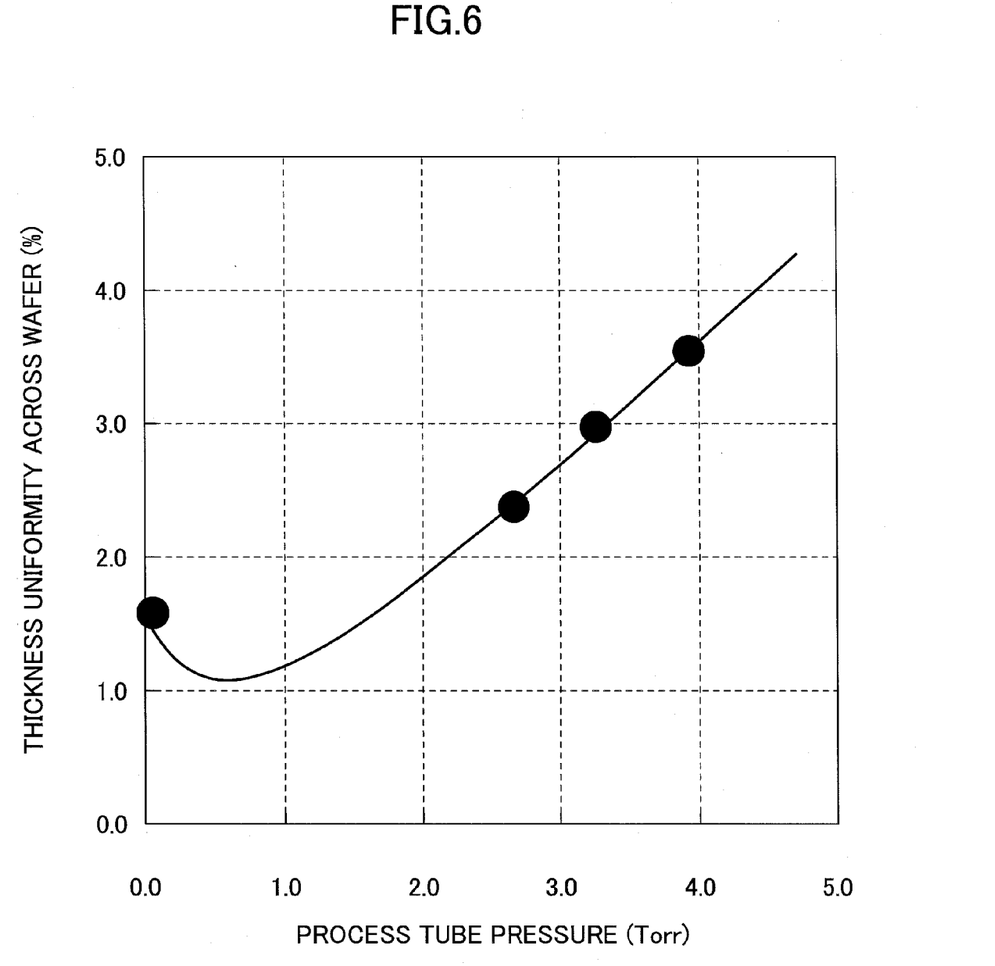
FIG. 6 is graph that illustrates a film thickness uniformity of the silicon nitride film deposited by the film deposition method according to the embodiment of the present invention.

In addition, FIG. 6 is a graph illustrating a film thickness uniformity of the silicon nitride film obtained in the experiment. As shown in FIG. 6, the film thickness uniformity becomes degraded as the pressure within the process tube 1 is increased from 2.67 Torr to 3.24 Torr and then to 3.91 Torr. It may be thought that this result indicates that the film thickness becomes more convexly distributed as the pressure within the process tube 1 is increased from 2.67 Torr. In addition, it may be thought from FIG. 6 that the concave distribution is changed to the convex distribution at a pressure of about 0.5 Torr (66.7 Pa) within the process tube 1 at Step S32. In other words, when the pressure within the process tube 1 is in a range from 0.08 Torr to 0.5 Torr the silicon nitride film thickness is concavely distributed, and when the pressure within the process tube 1 exceeds 0.5 Torr the silicon nitride film thickness is convexly distributed.

An arrangement by which film thickness distribution can be controlled by the pressure within the process tube 1 before supplying the DCS gas into the process tube 1 may be understood in the following manner.

Figure 7:
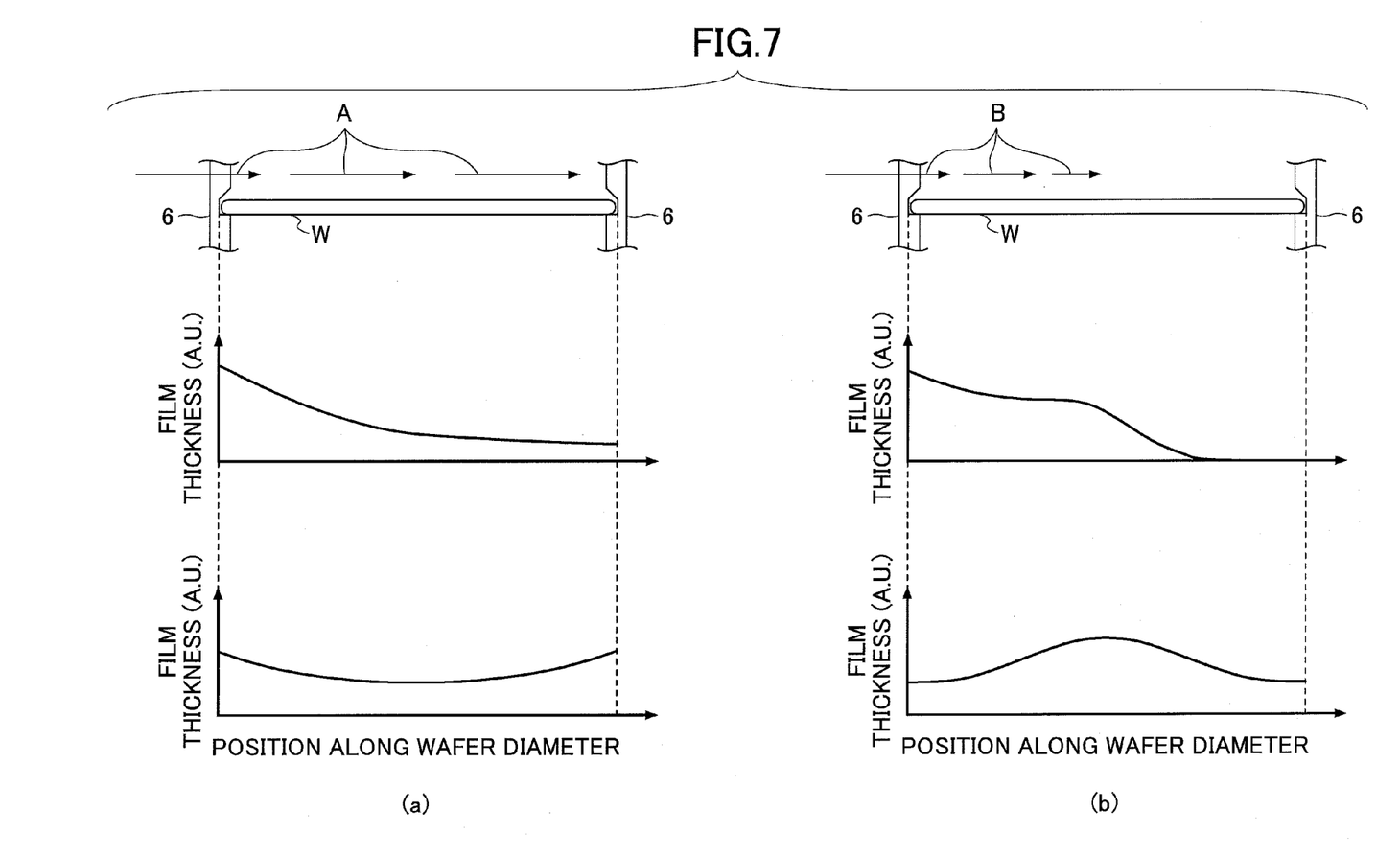
FIG. 7 is a view for explaining how a film thickness distribution can be controlled by the film deposition method according to the embodiment of the present invention.

First, when the pressure within the process tube 1 is relatively low, the DCS gas supplied into the process tube 1 can reach a point that is relatively far away from the gas ejection holes of the silicon-containing gas distribution nozzle 22, as shown by arrows A in an upper section of Section (a) of FIG. 7. This is because a mean free path of gas molecules becomes longer when the pressure within the process tube 1 is lower. In this case, if the DCS gas and the NH$_3$ gas are alternately supplied to the process tube 1 in the aforementioned manner without rotating the wafer boat 5, the silicon nitride film becomes gradually thinner in a direction from a front edge near the gas ejection holes 22a to a distal edge of the wafer W (or along a gas flowing direction), as shown in a middle section of Section (a) of FIG. 7. In this situation, when the wafer boat 5 is rotated, the film thickness in a front edge area and the film thickness in a distal edge area can be offset, so that the film thicknesses in the front and the distal edge areas become substantially (the film thickness in the front edge area+the film thickness in the distal edge area)/2, which is still greater than the film thickness of the silicon nitride film in a center area of the wafer W. Therefore, the silicon nitride film thickness becomes concavely distributed, as shown in a lower section of Section (a) of FIG. 7.

On the other hand, when the pressure within the process tube 1 before the DCS gas is supplied to the process tube 1 is relatively high with the N$_2$ gas, the DCS gas is impeded by the nitrogen gas molecules and thus can only reach substantially halfway along the diameter of the wafer W, as shown by arrows B in an upper section of Section (b) of FIG. 7. In this case, if the DCS gas and the NH$_3$ gas are alternately supplied to the process tube 1 in the aforementioned manner without rotating the wafer boat 5, the silicon nitride film becomes gradually thinner in the direction from the front edge to the center area of the wafer W (or along the gas flowing direction) and suddenly thinner in an area slightly beyond the center area of the wafer W, as shown in a middle section of Section (b) of FIG. 7. In this situation, when the wafer boat 5 is rotated, the film thickness in the front edge area and the film thickness in the distal edge area can be offset, so that the film thicknesses in the front and the distal edge areas become substantially (the film thickness in the front edge area+the film thickness in the distal edge area)/2. Here, the film thickness in the distal edge area is substantially zero; the average thickness becomes less than the film thickness of the silicon nitride film in the center area of the wafer W. Therefore, the silicon nitride film thickness becomes convexly distributed, as shown in a lower section of Section (b) of FIG. 7.

As explained above, according to the embodiment of the present invention, a thin film having a desired film thickness distribution can be obtained by the ALD method.

While the present invention has been described in reference to the foregoing embodiments, the present invention is not limited to the disclosed embodiments, but may be modified or altered within the scope of the accompanying claims.

For example, when the $NH_3$ gas is supplied to the process tube 1 at Step S35, high frequency electric power is supplied to the plasma electrodes 33, 33, thereby activating the $NH_3$ gas to be plasma, in the above embodiment. However, the $NH_3$ gas may be supplied to the wafers W in the process tube 1 without utilizing the plasma in other embodiments. In this case, the $NH_3$ gas may be thermally decomposed by the heat of the wafers W thereby nitriding the DCS gas adsorbed on the upper surfaces of the wafers W. Even in this case, the film thickness distribution of the silicon nitride film can be controlled by the pressure within the process tube 1 before supplying the DCS gas into the process tube 1.

After the main valve MV is closed, the nitrogen gas is supplied to the process tube 1 at Step S32 in the above embodiment. In other embodiments, the nitrogen gas may be supplied to the process tube 1 while the main valve MV is kept open. In this case, when the pressure within the process tube 1 becomes a predetermined value with the nitrogen gas, supplying the nitrogen gas may be terminated and the main valve MV may be closed, and then the DCS gas is supplied to the process tube 1. Namely, the main valve MV may be closed when the DCS gas is supplied to the process tube 1. In addition, when the nitrogen gas is supplied to the process tube 1 while the main valve MV is kept open, the pressure within the process tube 1 may be controlled by the pressure controller PC.

In addition, when the nitrogen gas is supplied to the process tube 1 at Step S32, the buffer tank 180 may be used in the same manner as the buffer tank 180 is used for the silicon-containing gas. Namely, the nitrogen gas is supplied to the buffer tank 180 in advance and the nitrogen gas may be supplied in a single burst to the process tube 1 from the buffer tank 180 at Step S32. With this, the pressure within the process tube 1 rapidly becomes a predetermined value, thereby reducing a process time.

In addition, the DCS gas filling the buffer tank 180 is supplied to the process tube 1 at Step S33 in the above embodiment. However, in other embodiments, the DCS gas may be supplied at a flow rate controlled by the flow rate controller 17b from the nitrogen-containing gas source 17 to the process tube 1 without using the buffer tank 180.

Moreover, the nitrogen gas is supplied to the process tube 1 at Step S32 in the above embodiment; a noble gas such as helium (He) gas, argon (Ar) gas or the like may be used instead of the nitrogen gas.

Furthermore, the present invention is applicable to a silicon oxide film deposition carried out by employing the silicon-containing gas and an oxygen-containing gas. As the oxygen-containing gas, ozone ($O_3$) gas may be used. In addition, oxygen gas plasma may be used.

The pressure within the process tube 1 before supplying the silicon-containing gas is adjusted by supplying an inert gas to the process tube 1 in an embodiment of the present invention. The pressure may be determined taking into consideration a size of the process tube 1, a kind of inert gas, source gases to be used, or the like. In addition, the pressure may be determined taking into consideration a film thickness distribution suitable for the subsequent process. A preliminary experiment or a computer simulation is preferably carried out in order to determine the pressure.

In addition, the ALD apparatus 80 may be provided with and a purge gas supplying nozzle that goes through the manifold 3, and a purge gas supplying source that is connected to the purge gas supplying nozzle, in order to supply a purge gas to the process tube 1. With such a configuration, the purge gas may be supplied to the process tube 1 after the wafer boat 5 is transferred into the process tube 1, so that remaining air can be easily purged out from the process tube 1 with the purge gas. In addition, the DCS gas (or the $NH_3$ gas) supplied to the process tube 1 may be purged with the purge gas, before the $NH_3$ gas (or the DCS gas) is supplied to the process tube 1. With this, the DCS gas and the $NH_3$ gas are efficiently impeded from being intermixed with each other within the process tube 1, thereby assuredly realizing the ALD of the silicon nitride film.

Incidentally, it is preferable that the inert gas is supplied to the process tube 1 at Step S32 (FIG. 3), namely before supplying the DCS gas, through the silicon-containing gas supplying pipe 20L and the silicon-containing gas distribution nozzle 22. This is because a flow pattern of the inert gas in the process tube 1 is substantially the same as a flow pattern of the silicon-containing gas that is supplied to the process tube 1 after the inert gas, and thus the silicon-containing gas can reach the upper surfaces of the wafers W in the wafer boat 5 without being disturbed. If the inert gas is supplied to the process tube 1 through the purge gas supplying nozzle described above, the inert gas may excessively perturb the flow pattern of the silicon-containing gas, so that the silicon-containing gas cannot be uniformly adsorbed on the upper surfaces of the wafers W. However, the silicon-containing gas may be supplied to the process tube 1 without being disturbed after the inert gas supplied through the purge gas supplying nozzle calms down and is distributed uniformly in the process tube 1.

What is claimed is:

1. A film deposition method of depositing a silicon nitride thin film by alternately supplying at least a first source gas and a second source gas to a substrate thereby allowing the first and the second source gases to react with each other on the substrate, the film deposition method comprising steps of:

evacuating a process chamber where the substrate is accommodated, without supplying any gas to the process chamber;

supplying an inert gas to the process chamber until a pressure within the process chamber becomes a predetermined pressure;

supplying the first source gas to the process chamber at the predetermined pressure without evacuating the process chamber after supplying the inert gas to the process chamber;

stopping supplying the first source gas to the process chamber and evacuating the process chamber;

supplying the second source gas to the process chamber; and stopping supplying the second source gas to the process chamber and evacuating the process chamber, wherein the method further comprises adjusting the pressure within the process chamber in a range approximately between 0.08 Torr and 0.5 Torr before supplying the second source gas to the process chamber so that a thickness distribution of the silicon nitride thin film has a concave pattern where a thickness of the thin film becomes greater from a center area toward a circumferential area of the substrate, and increasing the pressure from approximately 0.5 Torr so that the thickness distribution of the thin film has a convex pattern where the thickness of the silicon nitride thin film becomes smaller from the center area toward the circumferential area of the substrate.

2. The film deposition method according to claim 1, wherein the inert gas is one of nitrogen gas and noble gases.

3. The film deposition method according to claim 1, wherein the inert gas is supplied to the process chamber through a gas line for supplying the first source gas to the process chamber.

4. The film deposition method according to claim 1, further comprising a step of retaining the first source gas in a buffer tank provided in a gas line that connects a first reaction gas supplying source and the process chamber.

* * * * *